(12) United States Patent
Ozeki et al.

(10) Patent No.: US 9,991,429 B2
(45) Date of Patent: Jun. 5, 2018

(54) LIGHT EMITTING DEVICE PACKAGE

(71) Applicant: LG Innotek Co., Ltd., Seoul (KR)

(72) Inventors: Satoshi Ozeki, Seoul (KR); Yuichiro Tanda, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 26 days.

(21) Appl. No.: 14/794,475

(22) Filed: Jul. 8, 2015

(65) Prior Publication Data

US 2016/0013382 A1 Jan. 14, 2016

(30) Foreign Application Priority Data

Jul. 8, 2014 (KR) ........................ 10-2014-0084909

(51) Int. Cl.

| H01L 33/60 | (2010.01) |
|---|---|
| H01L 33/62 | (2010.01) |
| H01L 33/54 | (2010.01) |
| H01L 33/48 | (2010.01) |
| H01L 23/00 | (2006.01) |
| H01L 33/64 | (2010.01) |

(52) U.S. Cl.
CPC .............. *H01L 33/60* (2013.01); *H01L 24/97* (2013.01); *H01L 33/486* (2013.01); *H01L 33/54* (2013.01); *H01L 33/62* (2013.01); *H01L 33/642* (2013.01); *H01L 2224/48091* (2013.01); *H01L 2224/48247* (2013.01)

(58) Field of Classification Search
CPC ......... H01L 33/60; H01L 33/62; H01L 33/48; H01L 2924/12041; H01L 33/54

USPC ........................................ 257/98, 88, 592.01
See application file for complete search history.

(56) References Cited

U.S. PATENT DOCUMENTS

| 7,964,943 B2 * | 6/2011 | Seo ........................ H01L 33/54 257/676 |
|---|---|---|
| 8,686,445 B1 * | 4/2014 | Hussell ................. H01L 33/486 257/88 |
| 2005/0280014 A1 * | 12/2005 | Park ...................... H01L 33/483 257/98 |
| 2007/0007558 A1 * | 1/2007 | Mazzochette ......... H01L 33/641 257/239 |
| 2007/0039164 A1 * | 2/2007 | Kwon ..................... H01L 33/62 29/592.1 |
| 2008/0023713 A1 * | 1/2008 | Maeda .................. H01L 33/486 257/98 |

(Continued)

FOREIGN PATENT DOCUMENTS

| EP | 1753036 A2 | 2/2007 |
|---|---|---|
| EP | 2187459 A2 | 5/2010 |
| JP | 2013251384 A1 * | 12/2012 ............. H01L 33/62 |

*Primary Examiner* — Matthew Reames
*Assistant Examiner* — John Bodnar
(74) *Attorney, Agent, or Firm* — Birch, Stewart, Kolasch & Birch, LLP

(57) ABSTRACT

A light emitting device package may be provided that includes: a lead frame; a light emitting device disposed on the lead frame; a metallic reflector which is disposed on the lead frame, has a hollow portion in which the light emitting device is disposed, reflects light emitted from the light emitting device, and is formed by a mold; and a resin body which surrounds the lead frame and the reflector. The resin body includes an insulation layer disposed between the lead frame and the reflector, and a protrusion disposed on the reflector.

12 Claims, 12 Drawing Sheets

(56) References Cited

U.S. PATENT DOCUMENTS

| | | | |
|---|---|---|---|
| 2008/0105888 A1* | 5/2008 | Wang | H01L 33/62 |
| | | | 257/98 |
| 2008/0210964 A1 | 9/2008 | Tomioka | |
| 2009/0283785 A1* | 11/2009 | Kim | H01L 33/505 |
| | | | 257/98 |
| 2010/0213484 A1 | 8/2010 | Lin | |
| 2012/0074451 A1 | 3/2012 | Lin | |
| 2012/0161186 A1 | 6/2012 | Katabe et al. | |
| 2012/0280116 A1* | 11/2012 | Krauter | H01L 33/486 |
| | | | 250/226 |
| 2014/0353701 A1* | 12/2014 | Abdul Karim | H01L 33/62 |
| | | | 257/98 |
| 2015/0076541 A1* | 3/2015 | Ikeda | H01L 33/60 |
| | | | 257/98 |
| 2015/0144972 A1* | 5/2015 | Soong | H01L 33/62 |
| | | | 257/88 |

\* cited by examiner

LIGHT EMITTING DEVICE PACKAGE

CROSS-REFERENCE TO RELATED APPLICATION

The present application claims priority under 35 U.S.C. § 119(a) of Korean Patent Application No. 10-2014-0084909 filed Jul. 8, 2014, the subject matters of which are incorporated herein by reference.

BACKGROUND

Field

This embodiment relates to a light emitting device package.

Description of Related Art

A light emitting diode (LED) is a light source with high efficiency and environmental friendliness and becomes popular in a variety of fields. The LED is being used in various fields, for example, a display, optical communication, an automobile and general lighting. Particularly, demand for a white light emitting diode creating white light is gradually increasing.

In general, after an individual element is manufactured, such a light emitting device is used by packaging the elements. In the light emitting device package, a light emitting chip is mounted on a resin body including a heat sink. The light emitting chip is electrically connected to a lead through a wire. The upper portion of the light emitting chip is filled with a sealing material. A lens is provided on the upper portion. In the light emitting device package having the described structure, since heat generated by operating the light emitting device is slowly transmitted, the light emitting device package has a low heat radiation effect. Therefore, the optical characteristics of the light emitting device may be deteriorated and a package process in which the heat sink is inserted between the resin bodies is difficult to have a high process speed.

When the light emitting device is mounted on a lead frame without the heat sink, the heat is released through the lead frame, so that heat radiation performance is degraded. Therefore, a high power light emitting device is difficult to be mounted on the lead frame. Also, when the resin body which is used in the lead frame for the light emitting device is exposed to the light for a long time, the resin body is discolored or deteriorated, so that the optical characteristics are deteriorated.

When light emitted from the light emitting device is incident on the resin body, the reflectance is low. Accordingly, for the purpose of increasing the reflectance of the light emitting device package, it is required to reduce the resin body in the area reflecting the light.

SUMMARY

One embodiment is a light emitting device package. The light emitting device package includes: a lead frame; a light emitting device disposed on the lead frame; a metallic reflector which is disposed on the lead frame, has a hollow portion in which the light emitting device is disposed, reflects light emitted from the light emitting device, and is formed by a mold; and a resin body which surrounds the lead frame and the reflector. The resin body includes an insulation layer disposed between an entire bottom surface of the reflector and a top surface of the lead frame, and a protrusion disposed on the reflector.

Another embodiment is a light emitting device package. The light emitting device package includes: a lead frame; a light emitting device disposed on the lead frame; a metallic reflector which is disposed on the lead frame, has a reflective surface surrounding the light emitting device, and is formed by a mold; and a resin body which surrounds the lead frame and the reflector. The resin body has a recess into which a portion of the reflector is inserted and fixed.

BRIEF DESCRIPTION OF THE DRAWINGS

Arrangements and embodiments may be described in detail with reference to the following drawings in which like reference numerals refer to like elements and wherein:

FIG. 3b is a partial enlarged view of FIG. 3a;

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

Figure 1:
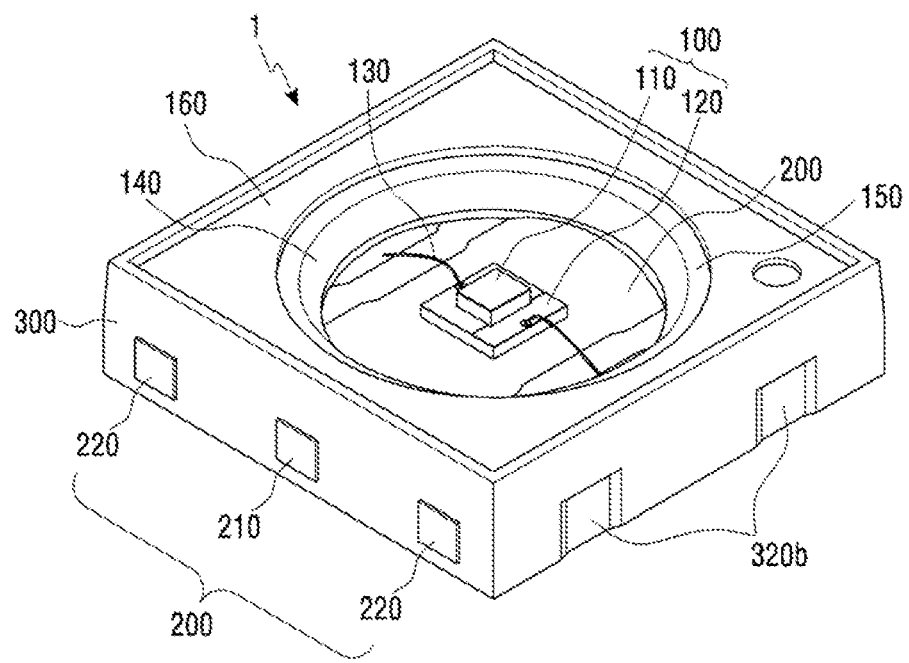
FIG. 1 is a perspective view of a light emitting device package according to an embodiment.
Figure 2:
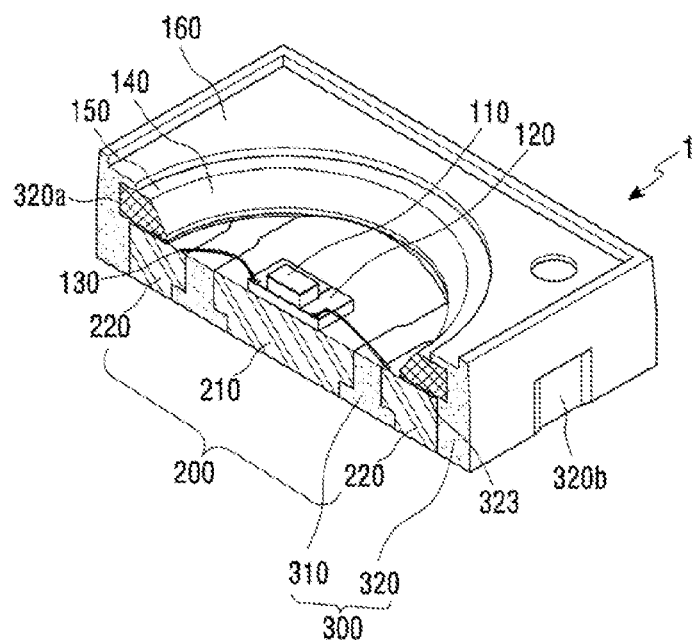
FIG. 2 is a sectional perspective view of the light emitting device package according to the embodiment.
Figure 3A:
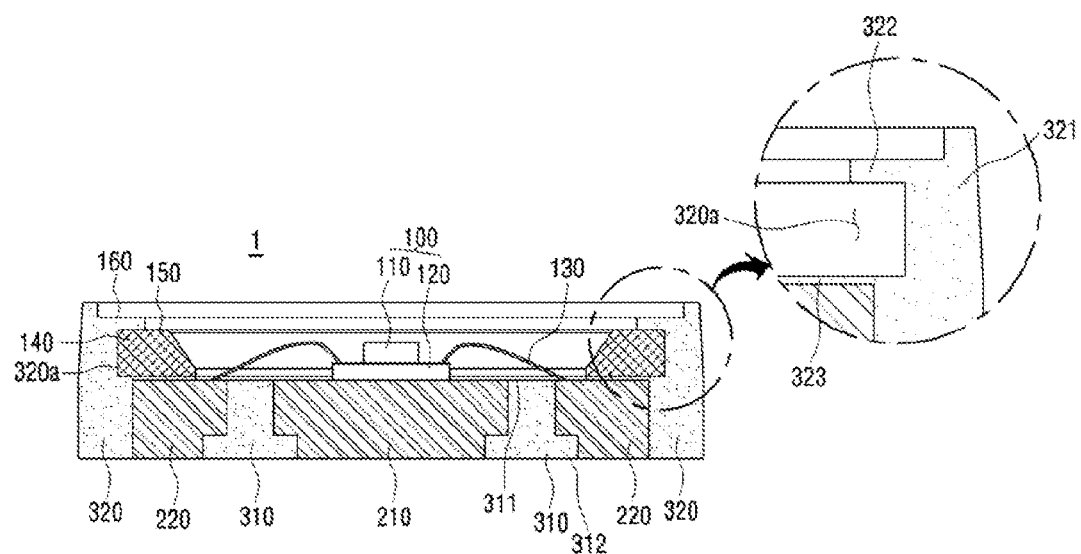
FIG. 3a is a cross sectional view of the light emitting device package according to the embodiment.
Figure 3B:
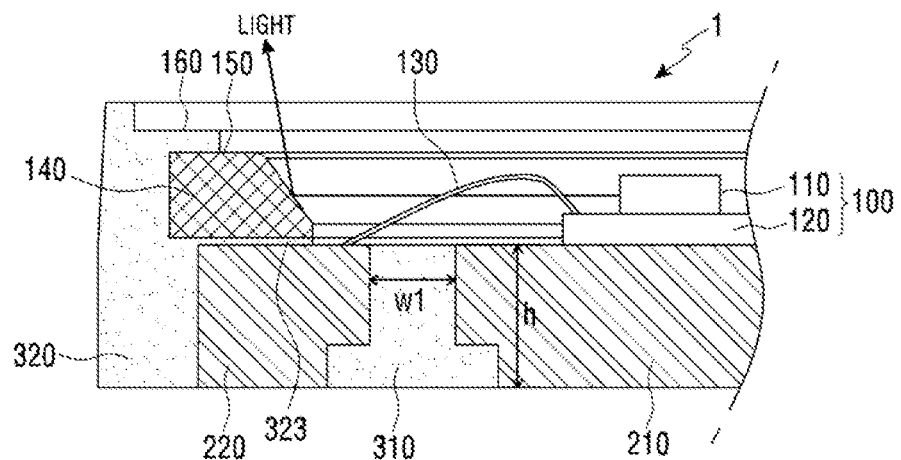

FIG. 1 is a perspective view of a light emitting device package according to an embodiment. FIG. 2 is a sectional perspective view of the light emitting device package according to the embodiment shown in FIG. 1. FIG. 3a is a cross sectional view of the light emitting device package according to the embodiment shown in FIG. 2. FIG. 3b is a partial enlarged view of FIG. 3a.

Referring to FIGS. 1 to 3b, a light emitting device package 1 according to the embodiment may include a light emitting device 100 including light emitting chip 110 and a sub mount 120 on which the light emitting chip 110 is disposed, a lead frame 200 on which the light emitting device 100 is disposed, a wire 130 which electrically connects the light emitting device 100 with the lead frame 200, a reflector layer 140 which surrounds the light emitting device 100 and reflects the light emitted from the light emitting device 100, an insulation layer 323 which is located between the lead frame 200 and the reflector layer 140, and a resin body 300 which forms the body of the light emitting device package 1.

The light emitting device 100 may be a light emitting diode (LED). However, there is no limit to this. The light emitting diode may be a deep ultraviolet (DUV) LED which emits deep ultraviolet. However, there is no limit to this. The light emitting diode may be red, green, blue or white light emitting diodes which emit red, green, blue or white light respectively. The light emitting diode is a kind of a solid state component which converts electrical energy into light and generally includes a semiconductor-made active layer interposed between two opposite doped layers. When a bios is applied to both ends of the two doped layers, electron holes and electrons are injected into the active layer and recombined with each other in the active layer, and then light is generated. The light generated in the active layer is emitted in all directions or in a particular direction, and then is emitted outside the light emitting diode through an exposed surface.

The light emitting chip 110 may be a flip chip. However, the light emitting chip 110 is not necessarily limited to this. The light emitting chip 110 may be a vertical chip or a lateral chip. For convenience, in the drawings, the lateral chip will be described. The light emitting chip 110 may be formed to have 600 um in width and 700 um in length and is not necessarily limited to this. The light emitting chip 110 may emit deep ultraviolet with a wavelength of from 190 nm to 400 nm. More specifically, the light emitting chip 110 may emit deep ultraviolet with a wavelength of from 250 nm to 280 nm, and in this case, the deep ultraviolet which is emitted from the light emitting chip 110 has the most excellent sterilizing power. Though not shown in FIG. 1, the light emitting chip 110 may include a substrate and a light emitting structure in which a first conductive semiconductor layer, an active layer, and a second conductive semiconductor layer which are sequentially disposed on the substrate. The substrate of the light emitting chip 110 may have light transmission characteristics that allow the light to pass therethrough. The substrate may be at least any one of both an insulation substrate such as sapphire ($Al_2O_3$), spinel ($MgAl_2O_4$) and a semiconductor substrate such as SiC, Si, GaAs, GaN, InP, Ge, etc.

The light emitting chip 110 is mounted on the sub mount 120. The sub mount 120 radiates the heat generated by the light emitting chip 110 and transfers the heat to the lead frame 200 located thereunder. Also, an end of the wire 130 electrically connecting the light emitting device 100 with the lead frame 200 is connected to the sub mount 120. The sub mount 120 may be made of a material having high thermal conductivity like AlN or SiC, etc., and is not necessarily limited to this.

Referring to FIGS. 2 to 3b, the reflector 140 of the light emitting device package 1 according to the embodiment reflects the light emitted from the light emitting device 100. The reflector 140 surrounds the light emitting device 100 and is disposed on the lead frame 200. The reflector 140 may be made of a metallic material. Specifically, the reflector 140 of the light emitting device package 1 according to the embodiment may be made of pure aluminum. Therefore, the reflector 140 may have a high optical reflectance, a high thermal diffusivity and corrosion resistance to oxygen and hydrogen sulfide. The reflector 140 may have an inward concave circular shape and the shape of the reflector 140 is not necessarily limited to the circular shape.

A lens guide 150 on which an optical lens may be disposed may be formed on the reflector 140. A plate guide 160 on which a plate may be disposed may be formed on the reflector. The lens guide 150 may be formed by both the top surface of the reflector 140 and a wall 321 formed by an end of a below-described second resin body 320. Also, the plate guide 160 may be formed by both a flat portion formed on the top surface of the second resin body 320 and one side of the wall protruding upward. This will be described later. A sealing resin material may be filled between the reflector 140 and the optical lens or between the reflector 140 and the plate. A silicone resin may be used as the sealing resin material. Meanwhile, the optical lens or the plate according to the embodiment may be a glass lens or a glass plate, which includes a fluorescent material. Therefore, since the optical lens or the plate includes the fluorescent material without dispersion of the fluorescent material within the optical lens or the plate or without using the sealing material including the fluorescent material, Lumen maintenance can be improved. In other words, the reliability of the light emitting device package 1 can be improved.

The lead frame 200 is disposed under the light emitting device 100. The light emitting device 100 is disposed on the lead frame 200. The lead frame 200 may include a first frame 210 on which the light emitting device 100 is directly disposed, and a second frame 220 which is electrically connected to the light emitting device 100 through the wire 130. An opening into which a below-described first resin body 310 of the resin body 300 is inserted may be formed between the first frame 210 and the second frame 220. Meanwhile, the lead frame 200 may be made of a copper alloy including copper (Cu). Therefore, the lead frame 200 may have a thermal conductivity twice or three times higher than that of AlN of the sub mount 120. When the thickness of the lead frame 200 is increased, the lead frame 200 can function as a heat sink. Accordingly, the light emitting device package 1 according to the embodiment does not require a separate heat sink and is advantageous in cost due to the use of copper.

When the thickness of the lead frame 200 is increased, the lead frame 200 can function as a large-capacity heat sink. Although the increased thickness of the lead frame 200 increases the cost of the lead frame 200, the cost required for increasing the thickness is lower than a cost required for adding a separate heat sink. Also, the thicker the copper-made lead frame 200, the higher the thermal diffusivity and the less the thermal expansion. When the thickness of the lead frame 200 is increased, a friction force between the lead frame 200 and the resin body 300 increases and foreign substances and moisture are difficult to permeate into the light emitting device package 1 from the bottom of the lead frame 200. Also, the increased thickness of the lead frame 200 increases resistance to the transformation due to an external stress.

Specifically, the thickness of the copper-made lead frame 200 may be from 0.5 mm to 1.5 mm. When the thickness of the lead frame 200 is less than 0.5 mm, the thermal diffusivity and heat radiation performances are degraded. When the thickness of the lead frame 200 is larger than 1.5 mm, the manufacturing cost may be increased by the increase of the thickness of the lead frame 200 as compared with the increases of the thermal diffusivity and heat radiation performance. Also, when the thickness of the copper-made lead frame 200 is less than 0.5 mm, resistance to the transformation of the light emitting device package 1 due to an external stress may become less than an acceptable value. When the thickness of the lead frame 200 is larger than 1.5 mm, the manufacturing cost may be increased.

In summary, when the thickness of the copper-made lead frame 200 is less than 0.5 mm, any one of the thermal diffusivity, heat radiation, resistance to the transformation, and moisture permeation prevention performance becomes less than an acceptable value. These properties are improved with the increase of the thickness. However, when the thickness of the copper-made lead frame 200 is larger than 1.5 mm, the manufacturing cost may be more increased in the manufacture of the light emitting device package 1 as compared with the improvement of the described characteristics.

The light emitting device 100 may be directly disposed on the first frame 210. Though not shown in the drawings, a die-bonding plate to which the light emitting device 100 may be bonded may be formed on the top surface of the first frame 210. The light emitting device 100 may be disposed on the first frame 210 by using a die-bonding paste. The die-bonding paste may include an epoxy resin or silicone resin having light resistance. The second frame 220 may be electrically connected to the light emitting device 100 through the wire 130.

The resin body 300 of the light emitting device package 1 according to the embodiment may include the first resin body 310 which is inserted between the first frame 210 and the second frame 220 of the lead frame 200, and the second resin body 320 which surrounds the light emitting device 100 and the reflector layer 140 and has a central concave portion.

The first resin body 310 may be filled between the first frame 210 and the second frame 220. The second resin body 320 may be formed to surround the outside and a portion of the upper portion of the reflector 140. The first resin body 310 and the second resin body 320 may be formed by injection-molding or transfer molding a thermoplastic resin or a thermosetting resin on the lead frame 200. Various shapes of the first resin body 310 and the second resin body 320 can be formed by the design of the mold. This will be described later in detail.

A black resin having high weather resistance may be used as the thermoplastic resin or thermosetting resin which is used to form the first resin body 310 and the second resin body 320. For example, aromatic nylon which has a black color can be used. However, the black resin is not limited to this. A resin which is not black may be discolored or degraded due to long term exposure to heat and light from the light emitting device 100. Since the light emitting device package 1 according to the embodiment uses the black resin having high weather resistance, it is possible to prevent ultraviolet with a short wavelength from being degraded and to prevent the light emitting device package from being discolored. Therefore, when the light emitting device is a white light emitting diode, there is no need to use the black resin, and a white resin may be used. The white resin has an optical transmittance higher than that of the black resin, and thus, is advantageous in optical efficiency.

The insulation layer 323 is located between the reflector 140 made of a metallic material and the lead frame 200 made of a copper alloy, and insulates the reflector 140 from the lead frame 200. The insulation layer 323 may be made of a resin or may be integrally formed with the resin body 300. The thickness of the insulation layer 323 may be relatively less than the thicknesses of the reflector 140 and the lead frame 200. Specifically, the thickness of the insulation layer 323 may be from 0.1 mm to 0.15 mm. When the thickness of the insulation layer 323 is less than 0.1 mm, the stability of the insulation between the reflector 140 and the lead frame 200 may be reduced, and when the thickness of the insulation layer 323 is larger than 0.15 mm, the insulation layer 323 may be degraded by the light emitted from the light emitting device 100 or the insulation layer 323 may interfere with the light emitted from the light emitting device 100. Since the insulation layer 323 according to the embodiment of the present invention is sufficiently thin, the light which is emitted from the light emitting device 100 may be directly reflected by the reflective surface of the reflector 140 without being interfered by the insulation layer 323. Therefore, the resin-made insulation layer 323 is less degraded and the light emitting device package 1 according to the embodiment has a high reflection efficiency with respect to the light emitted from the light emitting device 100.

As shown in FIGS. 1 to 3*b*, the second resin body 320 may include a recess 320*a* and a concave portion 320*b*. A portion of the reflector 140 may be inserted and fixed into the recess 320*a*. An outer frame 410 of a below-described lead frame prototype 400 may be coupled to the concave portion 320*b*.

Specifically, the second resin body 320 may include the wall 321 which is vertically formed on the outsides of both the lead frame 200 and the reflector 140. A protrusion 322 may be formed which protrudes horizontally toward the light emitting device 100 from the wall 321. The protrusion 322 may cover at least a portion of the top surface of the reflector 140. The recess 320*a* may be formed to be surrounded by the wall 321 and the protrusion 322 of the second resin body 320 and by the top surface of the lead frame 200. Meanwhile, as described above, the insulation layer 323 may be inserted between the reflector 140 and the lead frame 200. Specifically, the insulation layer 323 formed integrally with the second resin body 320 may be disposed between the bottom reflector 140 and the top surface of the lead frame 200.

The reflector 140 is disposed on the lead frame 200. In the past, the reflector 140 was bonded on the lead frame 200 by using an adhesive. In this case, the residue of the adhesive pollutes electrodes or wires, etc. However, in the light emitting device package 1 according to the embodiment, the recess 320*a* is formed in the second resin body 320, and a portion of the reflector 140, for example, the outermost portion of the reflector 140 is inserted and fixed into the recess 320*a* of the second resin body 320. Therefore, since the reflector 140 is fixed on the lead frame 200 without using a separate adhesive, pollution caused by the adhesive can be prevented and the cost can be reduced.

Also, the light emitting device package 1 may include the lens guide 150 and the plate guide 160.

The top surface of the reflector 140 has a portion which is opened upward without being covered by the protrusion 322 protruding from the wall 321. This open portion and the end of the protrusion 322 may form the lens guide 150 on which the lens can be mounted. Also, there may be a level difference between the top surface of the wall 321 and the top surface of the protrusion 322. Due to the level difference, the plate guide 160 may be formed on which the plate can be mounted.

Meanwhile, the reflector 140 may be made of a high strength metallic material. Therefore, the reflector 140 is difficult to transform. When the reflector 140 is stably fixed on the lead frame 200, the reflector 140 is able to reflect the light at a high precision. The concave portion 320b will be described later.

Figure 4:
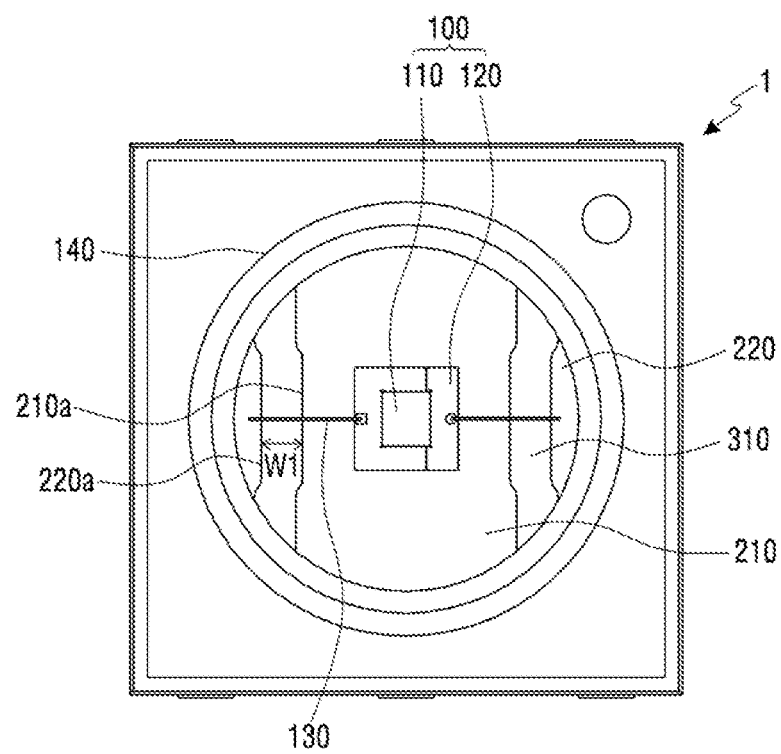
FIG. 4 is a plan view of the light emitting device package according to the embodiment.
Figure 5:
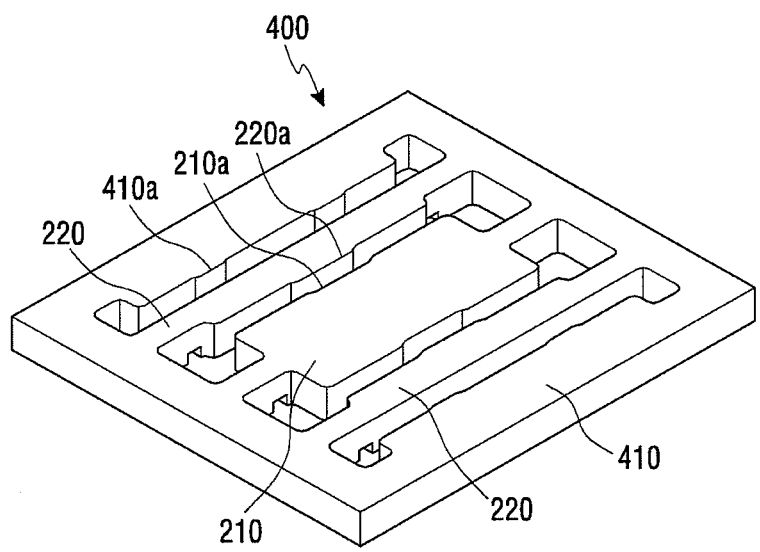
FIG. 5 is a perspective view of a lead frame.

FIG. 4 is a plan view of the light emitting device package according to the embodiment shown in FIG. 1. FIG. 5 is a perspective view of the lead frame shown in FIG. 1.

Referring to FIGS. 1 to 5, the reflector 140 may be disposed on the first frame 210 and the second frame 220. An opening may be formed inside the reflector 140. The light emitting device 100 may be disposed in the opening of the reflector 140 and may be filled with a resin.

As shown in FIGS. 4 and 5, the first frame 210 and the second frame 220 are partially uneven. Specifically, the first frame 210 may have a portion 210a concave toward the second frame 220. The second frame 220 may have a portion 220a convex toward the first frame 210 in response to the concave portion 210a of the first frame 210. Due to the uneven shapes of the first and second frames 210 and 220, a contact area between the first and second frames 210 and 220 and the first resin body 310 disposed between the first frame 210 and the second frame 220 increases. Therefore, the contact area between the lead frame 200 and the first resin body 310 increases, so that adhesion between the lead frame 200 and the resin body 300 is increased.

Also, as shown in FIGS. 2 to 5, the lead frame 200 of the light emitting device package 1 is a thick copper frame and has a high shape flexibility. Therefore, a level difference may be formed on the lead frame 200, and the opening formed between the first frame 210 and the second frame 220 also has a level difference. Therefore, since the first resin body 310 is filled according to the shape of the opening formed between the first frame 210 and the second frame 220, the contact area between both the first and second frames 210 and 220 and the first resin body 310 increases. Therefore, adhesion between the lead frame 200 and the first resin body 310 is increased. Also, since the lead frame 200 is coupled to the first resin body 310 in the form of a level difference, a function of preventing moisture or foreign substances from permeating from the bottom of the lead frame 200 is improved.

Figure 6:
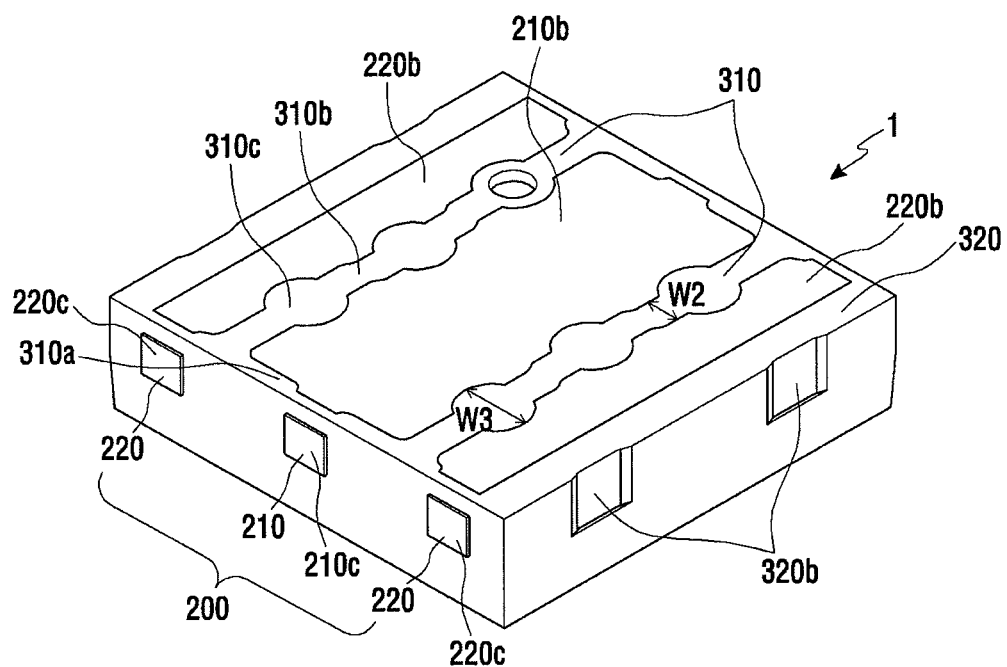
FIG. 6 is a bottom perspective view of the light emitting device package according to the embodiment.

FIG. 6 is a bottom perspective view of the light emitting device package according to the embodiment shown in FIG. 1.

Referring to FIGS. 1 to 6, the first resin body 310 is disposed between the first frame 210 and the second frame 220 of the lead frame 200. Both longitudinal ends 310a of the first resin body 310 extend toward the first frame 210 in the width direction thereof, so that a portion of both longitudinal ends of the first frame 210 may be buried by the first resin body 310. Therefore, a gap between the first resin body 310 and a terminal protruding outside the first frame 210 is removed, so that it is possible to prevent that the foreign substances, etc., which may occur by mounting the light emitting device 100 on the first frame 210, permeate into the light emitting device package 1 and pollute the wires or electrodes, etc.

Also, in the light emitting device package 1 according to the embodiment, since the thickness "h" of the lead frame 200 can be increased, the width "W1" of the first resin body 310 which is inserted into the opening between the first frame 210 and the second frame 220 can become narrower. Specifically, since the thickness "h" of the lead frame 200 is large, the contact area between the lead frame 200 and the first resin body 310 is sufficient. Therefore, the width "W1" of a top surface 311 of the first resin body 310 may become narrower. Specifically, the width "W1" of the top surface 311 of the first resin body 310 may be from 0.3 mm to 0.5 mm. When the width of the top surface 311 of the first resin body 310 is less than 0.3 mm, adhesion between the lead frame 200 and the first resin body 310 is not sufficient. When the width of the top surface 311 of the first resin body 310 is larger than 0.5 mm, the top surface of the lead frame, from which the light emitted from the light emitting device 100 is reflected, becomes narrower, so that the reflection efficiency may be degraded.

Also, as shown in FIGS. 2 to 6, in the light emitting device package 1, the shape of a bottom surface 312 of the first resin body 310 may be different from that of the top surface of the first resin body 310. The bottom surface 312 of the first resin body 310 may be formed to increase the contact area between the first resin body 310 and the lead frame 200. Therefore, the width of the bottom surface 312 of the first resin body 310 may be larger than that of the top surface of the first resin body 310 and may, as shown in FIG. 6, have a plurality of uneven structures. Specifically, the bottom surface 312 of the first resin body 310 may have a straight portion 310b and a curved portion 310c. The width "W2" of the straight portion 310b may be 0.1 mm larger than the width "W1" of the top surface 311. The width "W3" of the curved portion 310c may be 0.1 mm larger than the width "W2" of the straight portion 310b.

Figure 7A:
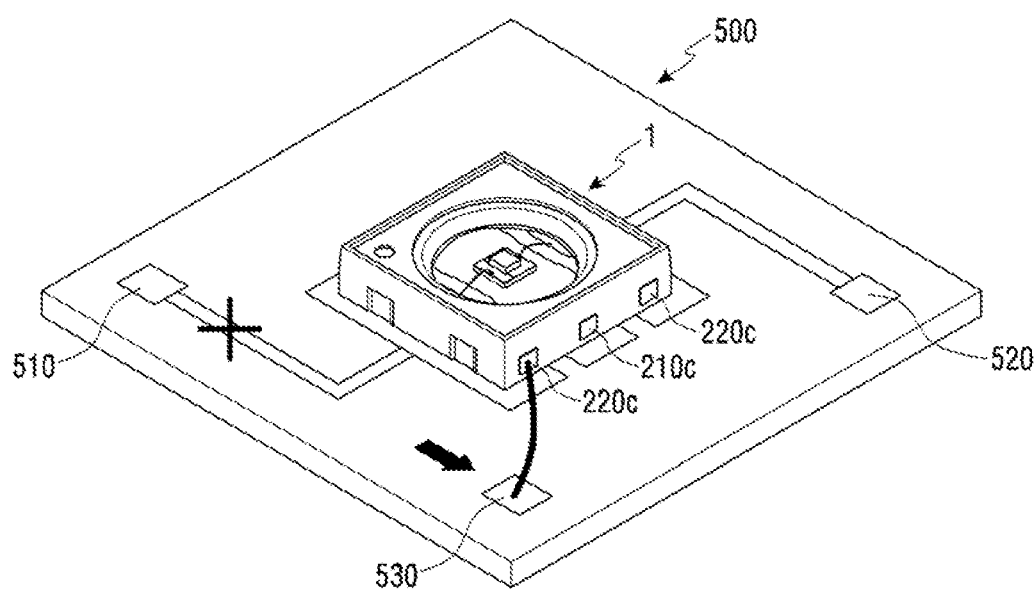
FIGS. 7a to 7c are perspective views showing that the light emitting device package according to the embodiment has been coupled to an external substrate.
Figure 7B:
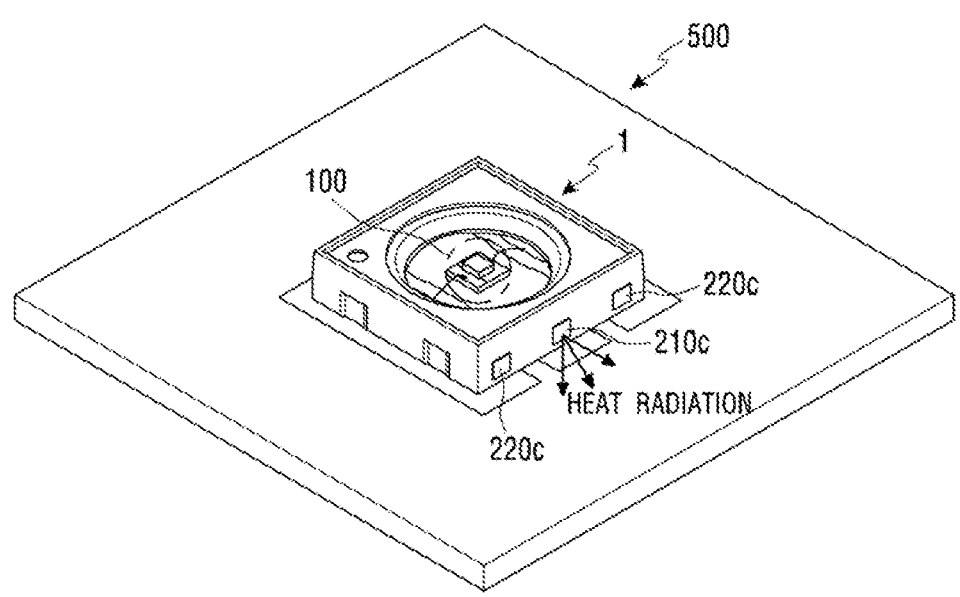
Figure 7C:
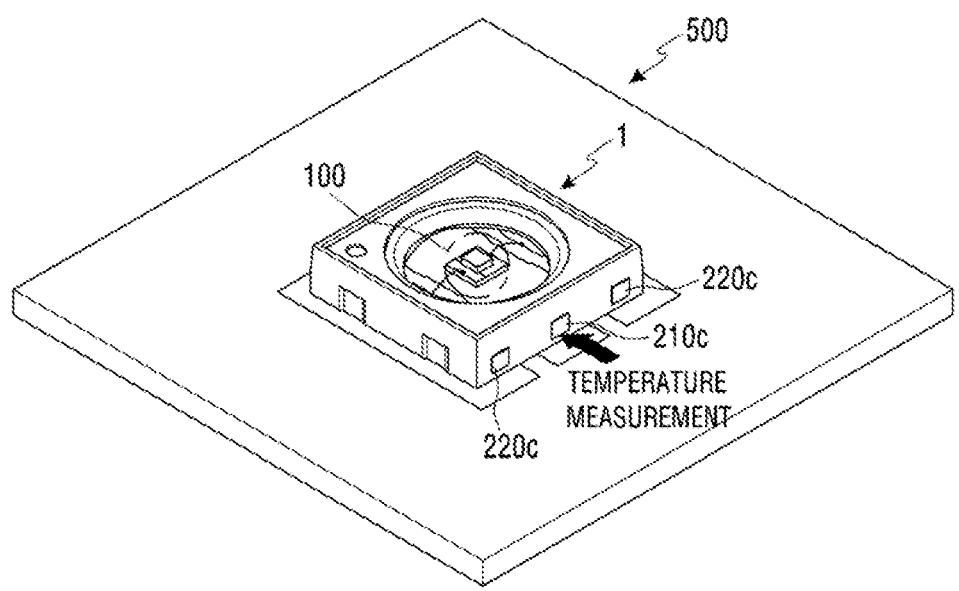

FIGS. 7a to 7c are perspective views showing that the light emitting device package according to the embodiment has been coupled to an external substrate.

As shown in FIGS. 6 to 7c, the lead frame 200 of the light emitting device package 1 according to the embodiment may include a main terminal formed on the bottom surface of the resin body 300 and an auxiliary terminal formed on the longitudinal side of the resin body 300. Specifically, the first frame 210 of the lead frame 200 may include a first main terminal 210b formed on the bottom surface of the resin body 300 and a first auxiliary terminal 210c formed on the side of the resin body 300. Also, the second frame 220 of the lead frame 200 may include a second main terminal 220b formed on the bottom surface and a second auxiliary terminal 220c formed on the side. Therefore, since the light emitting device package 1 according to the embodiment includes the main terminals 201b and 220b and the auxiliary terminals 210c and 220c which are for the connection to an external substrate 500, the light emitting device package 1 may be inspected or repaired by using the auxiliary terminals 210c and 220c. Also, the heat generated by the light emitting device 100 can be radiated by using the first auxiliary terminal 210c and the temperature of the light emitting device package 1 can be measured by using the first auxiliary terminal 210c.

FIGS. 7a to 7c show a detailed embodiment using the auxiliary terminals 210c and 220c of the lead frame 200 of the light emitting device package 1.

As shown in FIGS. 1 to 7a, the light emitting device package 1 according to the embodiment may be mounted on the external substrate 500. The light emitting device 100 of the light emitting device package 1 may be connected to the second frame 220 by the wire 130, and the second main terminal 220b of the second frame 220 may be connected to power electrodes 510 and 520. Here, when there is a problem in the connection of the power electrode 510 to any one of the second main terminals 220b, the second main terminal 220b can be connected to an auxiliary power electrode 530 by using the second auxiliary terminal 220c. Therefore, when there is a problem in the electrical connection between the light emitting device package 1 and the external substrate 500, the light emitting device package 1 can be inspected or repaired by using the second auxiliary terminal 220c without removing the light emitting device package 1 from the external substrate 500 or without additionally processing the external substrate 500.

Also, as shown in FIGS. 1 to 7c, the heat generated from the light emitting device 100 is transferred to the first frame 210, and the auxiliary terminals 210c and 220c are formed to be exposed on both sides of the light emitting device package 1. Therefore, the first auxiliary terminal 210c is able to function as a heat sink radiating the heat generated from the light emitting device 100. Also, the first auxiliary terminal 210c is able to function as a thermal calculator (TC) capable of measuring the temperature of the light emitting device 100. Since the light emitting device package 1 according to the embodiment is in direct contact with the light emitting device 100 and the lead frame 200, the temperature can be accurately measured.

Figure 8:
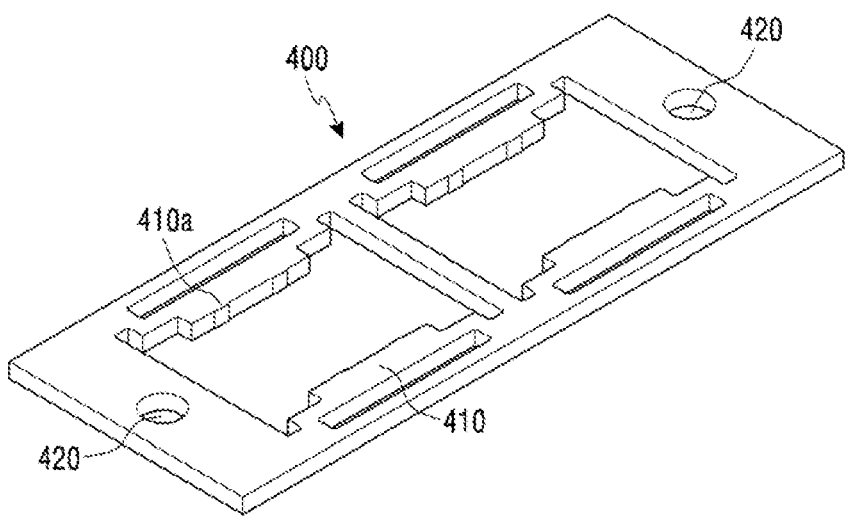
FIG. 8 is a perspective view of a lead frame prototype without the lead frame according to the embodiment.

FIG. 8 is a perspective view of the lead frame prototype without the lead frame according to the embodiment.

Referring to FIGS. 5 to 8, the lead frame prototype 400 may include the first frame 210, the second frame 220, and the outer frame 410. An opening may be formed respectively between the first frame 210, the second frame 220, and the outer frame 410. A resin may be filled in each of the openings.

As shown in FIGS. 1 to 8, the concave portion 320b may be formed on the outer upper portion of the second resin body 320. The lead frame prototype 400 may include a convex portion 410a formed on the outer frame 410 in response to concave portion 320b. Therefore, when the light emitting device package 1 has been coupled to the lead frame prototype 400, the convex portion 410a is inserted and fixed to the concave portion 320b and is caught by a catching protrusion formed on the upper portion of the concave portion 320b. Therefore, the downward movement of the light emitting device package 1 from the lead frame prototype 400 is limited. The light emitting device package 1 can be separated only upward from the lead frame prototype 400. Therefore, it is easy to store and transport the light emitting device package 1.

Also, since the lead frame prototype 400 is thick, there occurs a large friction force between the lead frame prototype 400 and the second outer resin body 320 of the light emitting device package 1. Therefore, the light emitting device package 1 can be fixed to the lead frame prototype 400 without using an adhesive. Since the light emitting device package 1 according to the embodiment is fixed to the lead frame prototype 400 without using an adhesive, foreign substances are not generated.

Figure 9:
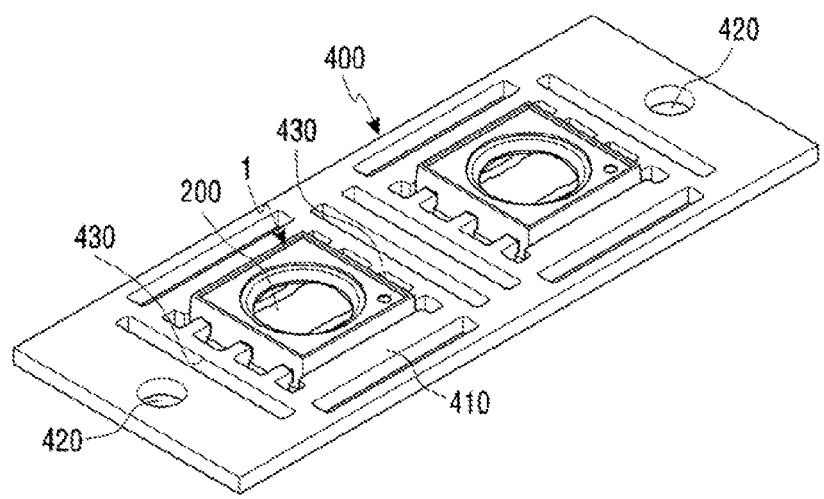
FIG. 9 is a perspective view showing that the light emitting device package without a light emitting device mounted thereon is coupled to the lead frame prototype.

FIG. 9 is a perspective view showing that the light emitting device package without the light emitting device mounted thereon is coupled to the lead frame prototype.

Referring to FIGS. 1 and 9, the light emitting device package 1 is disposed on the lead frame 200 of the lead frame prototype 400. When the resin body 300 is formed by molding a resin on the lead frame 200, the light emitting device 100 is mounted on the lead frame 200.

Here, the lead frame prototype 400 may include two lead frames 200 so as to mount two light emitting device packages 1.

Figure 10:
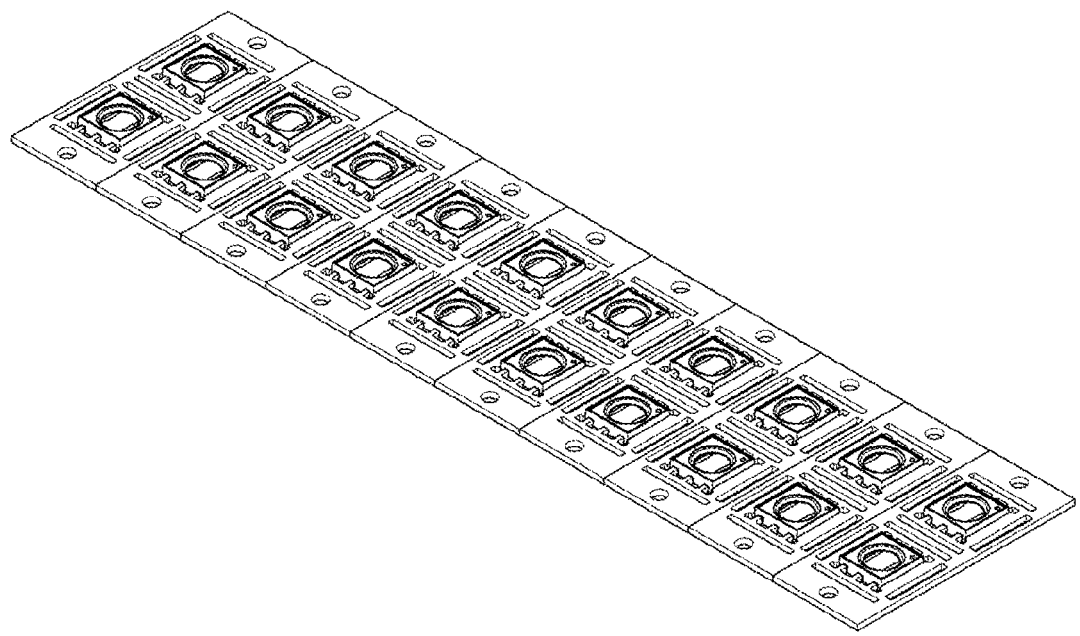
FIG. 10 is a perspective view showing a structure of the light emitting device package which can be mass-produced.

FIG. 10 is a perspective view showing a structure of the light emitting device package which can be mass-produced.

Referring to FIG. 10, the light emitting device package 1 according to the embodiment may be mass-produced extending in the form of two rows by a mold. Since the light emitting device package 1 can be mass-produced by the mold, the cost can be reduced.

When the light emitting chip of the light emitting device package 1 according to the embodiment is an LED emitting visible light, the light emitting device package according to the embodiment can be used in a lighting device such as a variety of indoor outdoor liquid crystal displays, an electric sign, a street lamp, etc. Meanwhile, when the light emitting chip of the light emitting device package is a DUV LED emitting deep ultraviolet, the light emitting device package according to the embodiment can be used in a humidifier or a water purifier for sterilization or purification.

Hereafter, a process of manufacturing the light emitting device package 1 according to the embodiment will be described.

FIGS. 11a to 11f are views for describing a process of manufacturing the light emitting device package 1 according to the embodiment shown in FIG. 1.

The light emitting device package 1 may be manufactured by a mold. Since the light emitting device package 1 is manufactured upside down, the manufacturing process will be described upside down.

Figure 11A:
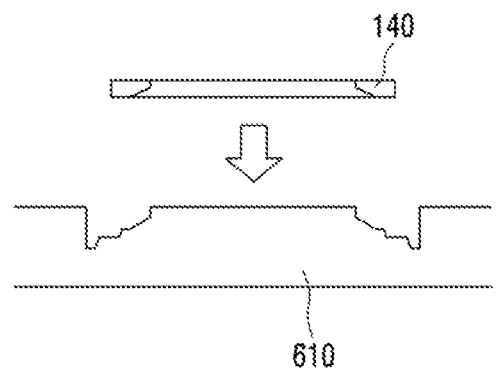
FIGS. 11a to 11f are views for describing a process of manufacturing the light emitting device package according to the embodiment.
Figure 11B:
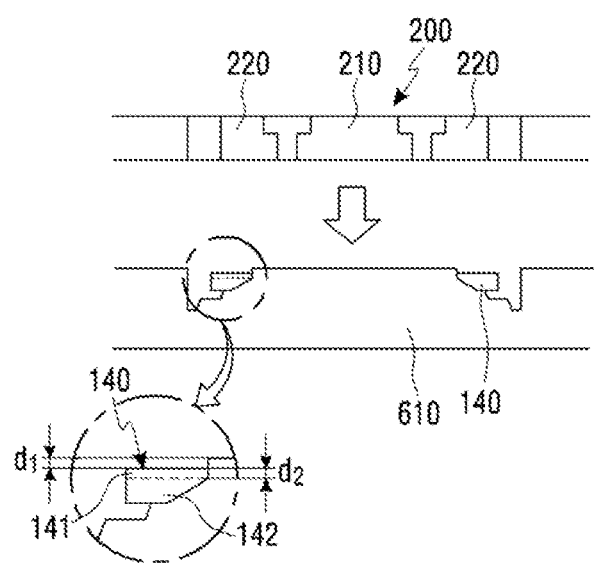
Figure 11C:
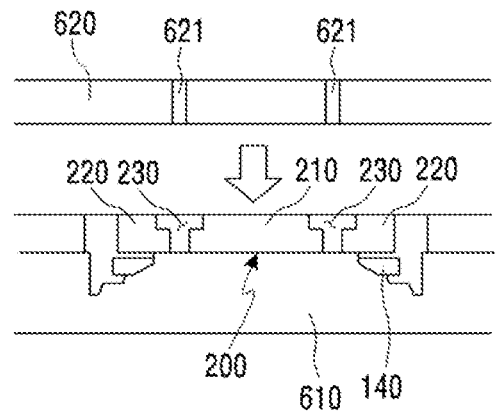
Figure 11D:
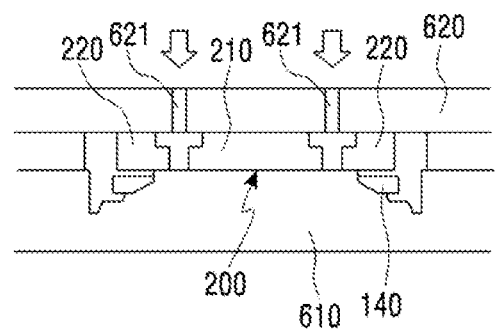
Figure 11E:
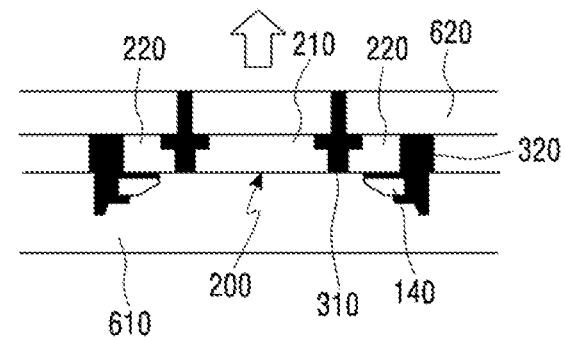
Figure 11F:
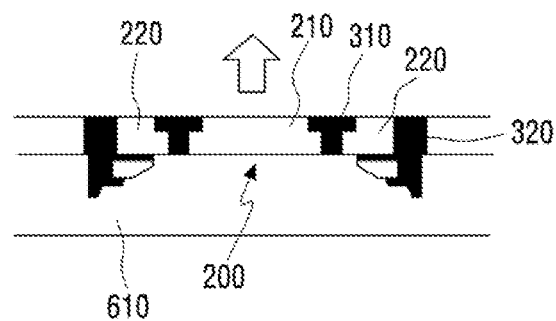

First, as shown in FIG. 11a, the reflector 140 is coupled to a lower mold 610. Then, as shown in FIG. 11b, the lead frame 200 is coupled to the lower mold 610 to which the reflector 140 has been coupled. Next, as shown in FIG. 11c, an upper mold 620 is coupled on the lead frame 200. Here, a resin injection portion 621 is coupled in response to the opening 230 formed between the first frame 210 and the second frame 220 of the lead frame 200. Subsequently, as shown in FIG. 11e, a resin is injected through the resin injection portion 621. The first resin body 310 and the second resin body 320 are formed by the injected resin. Subsequently, as shown in FIG. 11f, the upper mold 620 is removed from the lead frame 200. Lastly, the lead frame 200, the reflector 140, the first resin body 310 and the second resin body 320 are removed from the lower mold 610, and as a result, the light emitting device package 1 is formed. The thus formed light emitting device package 1 is shown in FIG. 8.

Referring to FIGS. 11a to 11c, the reflector 140 is disposed on the lead frame 200 and has a central hollow portion in which the light emitting device is disposed. The reflector 140 includes a base 141 and an inclined portion 142. The base 141 is formed vertically upward from the lead frame 200. The inclined portion 142 has an inclined reflective surface and is disposed on the base 141. Here, since the reflector 140 is formed by a mold, the reflector 140 may be made of a metallic material, and the base 141 and the inclined portion 142 may be integrally formed with each other.

In the light emitting device package 1 according to the embodiment, since the reflector 140 is integrally formed by a mold, the reflector 140 is wholly uniformly formed, so that the reflection precision is improved. Also, in the past, a lead has been used for convenience of manufacture of the reflector 140. However, the reflector 140 of the light emitting device package 1 according to the embodiment does not require the lead, so that it is possible to prevent foreign substances, etc., from permeating into the light emitting device package 1 from the outside through the resin body 300. Also, the reflector 140 includes the inclined portion 142 having an inclined reflective surface, in order to reflect the light emitted from the light emitting device. The inclined portion 142 may be inclined in a direction in a mold process of the light emitting device package 1. Therefore, since the light emitting device package 1 according to the embodiment includes the base 141 which is formed under and integrally with the inclined portion 142, the inclined portion 142 of the reflector 140 can be prevented from being inclined. The light emitting device package 1 may be manufactured such that the reflector 140 and the lead frame 200 are spaced from each other by at least 0.1 mm. The insulation layer 323 shown in FIG. 3 may be formed in the space formed between the reflector 140 and the lead frame 200.

Figure 12:
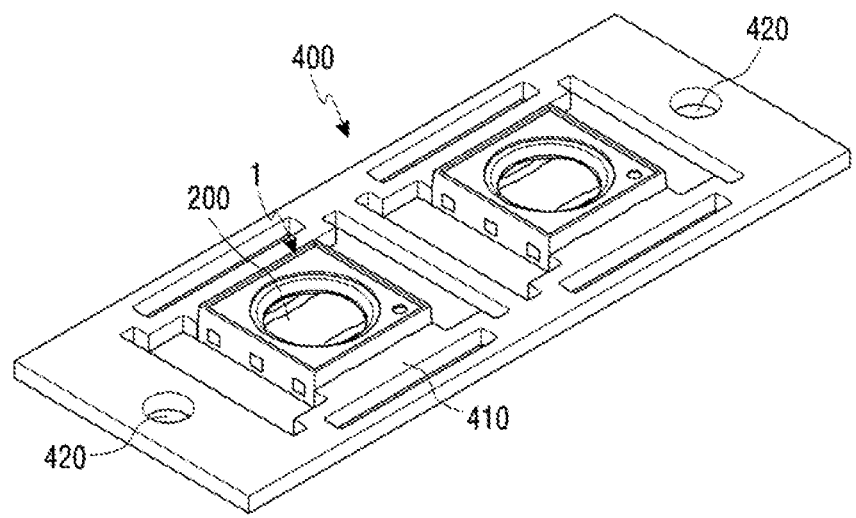
FIG. 12 is a view showing the final form where the light emitting device package according to the embodiment has been formed on the lead frame prototype.

FIG. 12 is a view showing the final form where the light emitting device package according to the embodiment has been formed on the lead frame prototype.

In the light emitting device package 1 according to the embodiment, a connection frame 430 shown in FIG. 9 between the lead frame 200 and the lead frame prototype 400 has been removed. Therefore, since the light emitting device package 1 according to the embodiment is caught by and coupled to the lead frame prototype 400, the light emitting device package 1 can be easily removed from the lead frame prototype 400.

As such, the reflector 140 of the light emitting device package 1 according to the embodiment has a higher accuracy than that of a reflector formed by plating or molding a thin metal plate on the lead frame 200. Since the reflector 140 of the light emitting device package 1 according to the embodiment is formed by a mold, the reflector 140 may be made of a metallic material and may be integrally formed without being cut. Therefore, the inclined surface of the reflector 140 of the light emitting device package 1 according to the embodiment can be processed, so that the reflectance can be more improved. In the past, the reflector has been formed by plating on a resin layer, etc., or by using a thin metal plate, and thus, the reflection of light was uneven. However, in the light emitting device package 1 according to the embodiment, the reflector 140 is integrally formed by a mold and is made of a metallic material, so that the light emitting device package 1 has high reflection precision. Also, since the reflector 140 of the light emitting device package 1 according to the embodiment is formed by a mold, the reflector 140 can be manufactured without using the lead. Accordingly, since the reflector 140 is completely surrounded by the second resin body 320, foreign substances, etc., do not permeate into the light emitting device package 1.

Figure 13A:
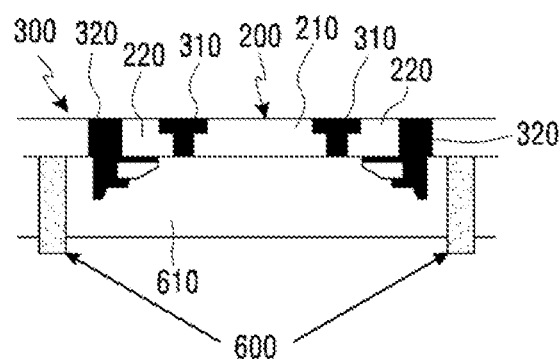
FIGS. 13a and 13b are views for describing that a release pin is removed from the light emitting device package according to the embodiment.
Figure 13B:
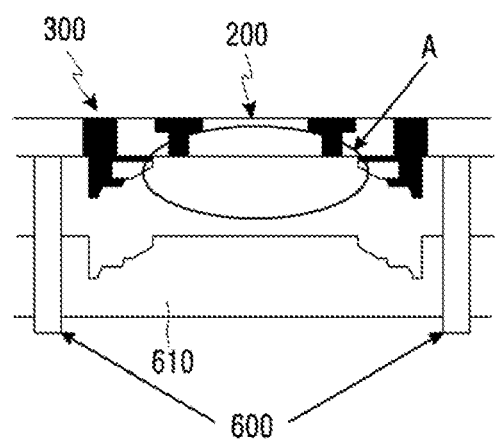

FIGS. 13a and 13b are views for describing that a release pin is removed from the light emitting device package according to the embodiment.

As shown in FIGS. 13a and 13b, in the light emitting device package 1 according to the embodiment, a release pin 600 for removing the reflector 140 from the lower mold 610 may be formed at the outside of the light emitting device package 1 instead of at the inside "A" of the light emitting device package 1. When the release pin 600 is located on the molded body, that is, at the outside of the light emitting device package 1, the lead frame 200 is curved and transformed. For this reason, it is common that the release pin 600 is located at the inside "A" of the molded body. A removal mark remains in the separation of the release pin 600 from the body. However, in the light emitting device package 1 according to the embodiment, the lead frame 200 is sufficiently thick. Accordingly, even when the release pin 600 is formed at the outside of the light emitting device package 1, the lead frame 200 can withstand a stress caused by the separation of the release pin 600. Therefore, since the release pin 600 is formed at the outside of the light emitting device package 1, the removal mark of the release pin 600 does not remain at the inside "A" in which the light emitting device is mounted or which is connected through the wire.

Figure 14A:
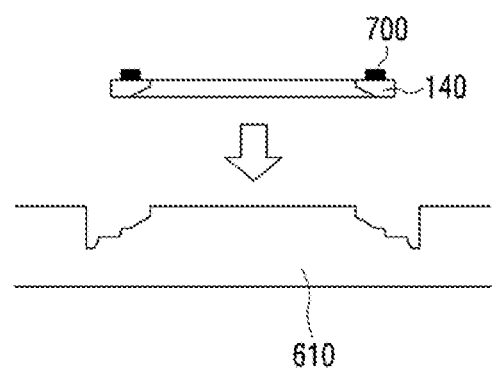
FIGS. 14a and 14b are views for describing how to couple a reflector and the lead frame in accordance with the embodiment.
Figure 14B:
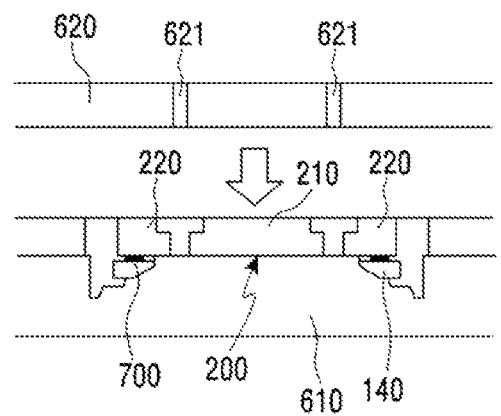

FIGS. 14a and 14b are views for describing how to couple a reflector and the lead frame in accordance with the embodiment.

As shown in FIGS. 11a to 11f and FIGS. 14a and 14b, in the aforementioned method for manufacturing the light emitting device package 1, an adhesive sheet 700 may be disposed on the reflector 140. The adhesive sheet 700 can adhere the reflector 140 to the second frame 220 of the lead frame 200. By using the adhesive sheet 700, a space between the lead frame 200 and the reflector 140 in which the insulation layer 323 is disposed can become smaller.

Although the embodiments of the present invention were described above, these are just examples and do not limit the present invention. Further, the present invention may be changed and modified in various ways, without departing from the essential features of the present invention, by those skilled in the art. That is, the components described in detail in the embodiments of the present invention may be modified. Further, differences due to the modification and application should be construed as being included in the scope and spirit of the present invention, which is described in the accompanying claims.

What is claimed is:
1. A light emitting device package comprising:
a lead frame;
a light emitting device disposed on the lead frame;
a metallic reflector disposed on the lead frame and formed by a mold, the reflector having a hollow portion in which the light emitting device is disposed, and reflecting light emitted from the light emitting device; and
a resin body which surrounds the lead frame and the reflector,
wherein the resin body comprises an insulation layer disposed between an entire bottom surface of the reflector and a top surface of the load frame, and a protrusion disposed on the reflector,
wherein the lead frame comprises a first frame on which the light emitting device is disposed, and a second frame which is disposed on both sides of the first frame respectively and is electrically connected to the light emitting device,
wherein the resin body comprises a first resin body disposed between the first frame and the second frame, and a second resin body which surrounds an outer surface of the second frame and an outer surface of the reflector,
wherein the first resin body comprises a top surface and a bottom surface,
wherein the top surface and the bottom surface of the first resin body each comprise a plurality of straight, portions and a plurality of curved portions,
wherein a width of the straight portion at the bottom surface is larger than a width of the straight portion at the top surface,
wherein a width of the curved portion at the bottom surface is larger than a width of the straight portion at the bottom surface,
wherein a width of a top surface of the first frame is larger than a width of a bottom surface of the first frame, wherein a width of the top surface of the first resin body is smaller than a width of the bottom surface of the first resin body, wherein the second resin body comprises a recess and a concave portion formed on a first side surface and a second side surface thereof, the first side surface arranged opposite to the second side surface with respect to the second resin body, wherein the reflector is inserted, and fixed into the recess, wherein the first frame of the lead frame comprises a first main terminal formed on a bottom surface of the resin body and a first auxiliary terminal formed on a side of the resin body, wherein the second frame of the lead frame comprises a second main terminal formed on the bottom surface and a second auxiliary terminal formed on the side of the resin body, wherein the first auxiliary terminal and the second auxiliary terminal are exposed to a third side surface of the resin body, the third side surface arranged between the first side surface and the second side surface, and wherein the first auxiliary terminal and the second auxiliary terminal are not exposed to the first and second side surfaces of the resin body.

2. The light emitting device package of claim 1, wherein the insulation layer extends from the second resin body and is disposed between the second frame and the reflector, and wherein the protrusion extends from the second resin body.

3. The light emitting device package of claim 2, wherein the protrusion is disposed on a portion of the top surface of the reflector, and wherein the remaining portion of the top surface of the reflector and a side of the protrusion form a lens guide.

4. The light emitting device package of claim 2, wherein the second resin body comprises a guide protrusion extending upward, and wherein the guide protrusion and the top surface of the protrusion form a plate guide.

5. The light emitting device package of claim 1, wherein the width of the top surface of the first resin body is from 0.3 mm to 0.5 mm.

6. The light emitting device package of claim 1, wherein the resin body comprises a concave portion which is disposed on an outer surface of the resin body and is coupled to a lead frame prototype, and wherein a catching protrusion is disposed on an upper portion of the concave portion.

7. The light emitting device package of claim 1, wherein an end of the first frame is disposed on a first side of the resin body and the other end of the first frame is disposed on a second side of the resin body, wherein an end of the second frame is disposed on the first side of the resin body, and the other end of the second frame is disposed on the second side of the resin body, and wherein the first side and the second side are opposite to each other.

8. The light emitting device package of claim 1, wherein the reflector comprises:

a base which is disposed vertically upward from the lead frame; and an inclined portion which is disposed on the base and has an inclination, wherein the reflector is made of pure aluminum.

9. The light emitting device package of claim 1, wherein a thickness of the insulation layer is from 0.1 mm to 0.15 mm.

10. The light emitting device package of claim 1, wherein a black resin is used as the resin body.

11. The light emitting device package of claim 1, wherein the second resin body comprises a guide protrusion which extends upward from the top surface of the second resin body.

12. The light emitting device package of claim 1, wherein the reflector is made of pure aluminum, and wherein a black resin is used as the resin body.

* * * * *